United States Patent
Li et al.

(10) Patent No.: US 10,205,045 B2
(45) Date of Patent: Feb. 12, 2019

(54) SOLAR CELL AND METHOD OF MANUFACTURING THE SAME

(71) Applicant: BOE Technology Group Co., Ltd., Beijing (CN)

(72) Inventors: Yanzhao Li, Beijing (CN); Yong Qiao, Beijing (CN); Long Wang, Beijing (CN); Yongchun Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1 day.

(21) Appl. No.: 14/891,755

(22) PCT Filed: May 19, 2015

(86) PCT No.: PCT/CN2015/079271
§ 371 (c)(1),
(2) Date: Nov. 17, 2015

(87) PCT Pub. No.: WO2016/086617
PCT Pub. Date: Jun. 9, 2016

(65) Prior Publication Data
US 2016/0359077 A1    Dec. 8, 2016

(30) Foreign Application Priority Data
Dec. 3, 2014  (CN) .......................... 2014 1 0727562

(51) Int. Cl.
*H01L 31/18*    (2006.01)
*H01L 31/068*   (2012.01)
(Continued)

(52) U.S. Cl.
CPC ...... *H01L 31/1804* (2013.01); *H01L 31/0288* (2013.01); *H01L 31/022425* (2013.01);
(Continued)

(58) Field of Classification Search
CPC .... H01L 31/0745; H01L 31/07; H01L 31/068
(Continued)

(56) References Cited

U.S. PATENT DOCUMENTS 4,398,343 A * 8/1983 Yamazaki ........... H01L 21/2686
                                                       136/258
4,485,121 A    11/1984 Matsumura
(Continued)

FOREIGN PATENT DOCUMENTS

CN    101246927 A    8/2008
CN    101859814 A    10/2010
(Continued)

OTHER PUBLICATIONS

Guo et al., (Selective Area Van der Waals Epitaxy of Topological Insulator Grid Nanostructures for Broadband Transparent flexible electrodes).*
(Continued)

*Primary Examiner* — Niki Bakhtiari
(74) *Attorney, Agent, or Firm* — Westman, Champlin & Koehler, P.A.

(57) ABSTRACT

A solar cell and a method of manufacturing the same are provided. The method comprises: forming a first electrode layer on a substrate; forming a semiconductor film of first conduction type on the first electrode layer; forming a germanium film on the semiconductor film of first conduction type, and topologizing the germanium film by using a functionalization element so as to obtain a semiconductor film of second conduction type having characteristics of topological insulator, the semiconductor film of first conduction type mating with the semiconductor film of second conduction type having characteristics of topological insulator to form a p-n junction; and forming a second electrode layer on the semiconductor film of second conduction type.

(Continued)

The solar cell manufactured according this method has higher electric energy conversion efficiency.

20 Claims, 1 Drawing Sheet

(51) Int. Cl.
*H01L 31/0224* (2006.01)
*H01L 31/0288* (2006.01)

(52) U.S. Cl.
CPC ........ *H01L 31/068* (2013.01); *H01L 31/1808* (2013.01); *Y02E 10/50* (2013.01)

(58) Field of Classification Search
USPC .................................................. 136/243–265
See application file for complete search history.

(56) References Cited

U.S. PATENT DOCUMENTS

| | | | | |
|---|---|---|---|---|
| 5,231,047 | A * | 7/1993 | Ovshinsky | H01L 31/202 136/258 |
| 2008/0230782 | A1* | 9/2008 | Antoniadis | H01L 31/0352 257/53 |
| 2012/0160315 | A1* | 6/2012 | Kim | H01L 31/022466 136/256 |
| 2012/0273763 | A1 | 11/2012 | Banerjee et al. | |
| 2013/0299780 | A1* | 11/2013 | McQueen | H01L 31/022408 257/14 |

FOREIGN PATENT DOCUMENTS

| | | |
|---|---|---|
| CN | 203071094 U | 7/2013 |
| CN | 104465874 A | 3/2015 |
| JP | H04-249374 A | 9/1992 |
| WO | 2013/035686 A1 | 3/2013 |

OTHER PUBLICATIONS

Second Office Action for Chinese Patent Application No. 201410727562.6, dated Sep. 8, 2016, 10 pages.
International Search Report and Written Opinion for International Application No. PCT/CN2015/079271, dated Aug. 26, 2015, 9 pages.
English translation of Box No. V from the Written Opinion for the International Searching Authority for International Application No. PCT/.
First Office Action, including Search Report, for Chinese Patent Application No. 201410727562.6, dated Mar. 30, 2016, 11 pages.

* cited by examiner

SOLAR CELL AND METHOD OF MANUFACTURING THE SAME

CROSS-REFERENCE TO RELATED APPLICATION

This application is a Section 371 National Stage Application of International Application No. PCT/CN2015/079271, filed 19 May 2015, entitled "SOLAR CELL AND METHOD OF MANUFACTURING THE SAME", which has not yet published, and which claims priority to Chinese Application No. 201410727562.6, filed on 3 Dec. 2014, incorporated herein by reference in their entirety.

BACKGROUND OF THE INVENTION

Field of the Invention

Embodiments of the present disclosure generally relate to the field of new energy technology, and particularly, to a solar cell and a method of manufacturing the same.

Description of the Related Art

The energy problem is always a hot topic concerning the human survival and development. The solar energy, as a new green energy, has gained extensive attention for a long time, and people are strengthening efforts to develop various solar cells, such as crystal silicon solar cells, amorphous silicon film solar cells, dye-sensitized solar cells, organic solar cells, and film solar cells based on new materials such as copper indium gallium selenium and the like. Currently, the first generation of solar cell, occupying the dominant position in the market and made of an amorphous silicon material, has very low electric energy conversion efficiency, which is only about 15%. Thus, one of urgent problems to be solved by those skilled in the art is to provide a solar cell having high electric energy conversion efficiency.

SUMMARY

The present disclosure provides a solar cell and a method of manufacturing the same, the solar cell manufactured according to the method having higher electric energy conversion efficiency.

According to one aspect of the present disclosure, there is provided a method of manufacturing a solar cell, comprising steps of:

forming a first electrode layer on a substrate;

forming a semiconductor film of first conduction type on the first electrode layer;

forming a germanium film on the semiconductor film of first conduction type, and topologizing the germanium film by using functionalization element so as to obtain a semiconductor film of second conduction type having characteristics of topological insulator, the semiconductor film of first conduction type mating with the semiconductor film of second conduction type having characteristics of topological insulator to form a p-n junction; and forming a second electrode layer on the semiconductor film of second conduction type.

In the solar cell manufactured according to the above method, the semiconductor film of first conduction type mates with the semiconductor film of second conduction type having characteristics of topological insulator to form a homogeneous p-n junction or heterogeneous p-n junction, photons are absorbed by semiconductor materials so as to form photon-generated carriers (holes and electrons), holes and electrons will move and gather in opposite directions under a built-in electric field in the p-n junction, and a current will be formed once a circuit is turned on, that is, a function of the solar cell is achieved. Since a theoretical value for the edge resistivity of the topological insulator may reach zero, a thermal loss of the semiconductor film having characteristics of topological insulator generated due to resistance effect is zero during carrier transportation, thereby enabling a highly-efficient solar cell, that is, the electric energy conversion efficiency of the solar cell is higher.

Thus, the solar cell manufactured according to the above method has higher electric energy conversion efficiency.

In the above method, the step of forming the germanium film may comprise:

forming the germanium film through an atomic layer deposition process; or forming the germanium film through a chemical vapor deposition process; or forming the germanium film through a mechanical stripping and transferring process; or forming the germanium film through a magnetron sputtering process; or forming the germanium film through a pulsed laser deposition process.

In the above method, the functionalization element may be fluorine element, chlorine element, bromine element or iodine element.

In the above method, the step of topologizing the germanium film by using a functionalization element so as to obtain a semiconductor film of second conduction type having characteristics of topological insulator may comprises halogenating the germanium film to obtain a germanium halide film by using a fluorine element, a chlorine element, a bromine element or an iodine element.

In the above method, the step of halogenating the germanium film to obtain the germanium halide film may comprise:

halogenating the germanium film by a gas phase process; or halogenating the germanium film by a liquid phase process; or halogenating the germanium film by a surface modification process; or halogenating the germanium film by a plasma treatment process In the above method, the semiconductor film of first conduction type may be an n-type silicon film, an n-type graphene film or an n-type germanium film.

In the above method, if the semiconductor film of first conduction type is an n-type silicon film, the step of forming a semiconductor film of first conduction type on the first electrode layer may comprise: depositing a silicon film having a thickness of 150 nm on the first electrode layer through a chemical vapor deposition process under a temperature of 200~400° C., and doping the silicon film with nitrogen element through a doping process so as to form an n-type semiconductor film;

if the semiconductor film of first conduction type is an n-type graphene film, the step of forming a semiconductor film of first conduction type on the first electrode layer may comprise: depositing a graphene film having a thickness of 1 nm on the first electrode layer through an atomic layer deposition process, and doping the graphene film with nitrogen element through a doping process so as to form an n-type semiconductor film;

if the semiconductor film of first conduction type is an n-type germanium film, the step of forming a semiconductor film of first conduction type on the first electrode layer may comprise: forming a first germanium film on the first electrode layer through a mechanical stripping and transferring process, and doping the first germanium film with nitrogen element and performing activating treatment so as to form an n-type semiconductor film.

In the above method, when halogenating the germanium film by the liquid phase process, the step of halogenating the germanium film to obtain the germanium halide film may comprise: halogenating the germanium film in a liquid bromine environment with a liquid bromine concentration of 1%~10% and a treatment temperature of 40~80° C., so as to form the germanium bromide film.

In the above method, when halogenating the germanium film by the gas phase process, the step of halogenating the germanium film to obtain the germanium halide film may comprise:

halogenating the germanium film in an iodine gas atmosphere with a gas pressure of 1~10 Pas and a treatment temperature of 60~100° C., so as to form a germanium iodide film; or halogenating the germanium film in a bromine gas atmosphere with a gas pressure of 1~10 Pa and a treatment temperature of 50~400° C., so as to form a germanium bromide film; or annealing the germanium film for 10 min in a chlorine gas atmosphere with a treatment temperature of 50~400° C., so as to form a germanium chloride film.

In the above method, when halogenating the germanium film by the gas phase process, the step of halogenating the germanium film to obtain the germanium halide film may comprise: halogenating the germanium film in a BCl3 gas atmosphere with a gas pressure of 1~10 Pa and a treatment temperature of 250~350° C.; and annealing the germanium film in a halogen gas atmosphere with a treatment temperature of 90~130° C., so as to form a germanium chloride film.

In the above method, when halogenating the germanium film by the surface modification process, the step of halogenating the germanium film to obtain the germanium halide film may comprise: coating an organic colloid material containing halogen on a base; and abutting, under a pressure, a side of base coated with the organic colloid material against the germanium film, so that halogen atoms in the organic colloid material are transferred to the germanium film, thereby halogenating the germanium film.

In the above method, when halogenating the germanium film by the plasma treatment process, the step of halogenating the germanium film to obtain the germanium halide film may comprise: causing halogen plasma to impact a surface of the germanium film in an inductively coupled plasma apparatus or a reactive ion etching apparatus, so that halogen plasma is absorbed in the germanium film, thereby halogenating the germanium film.

In the above method, the functionalization element may be hydrogen element, nitrogen element, boron element or sulfur element.

In the above method, at least a portion of at least one of the first electrode layer and the second electrode layer may be formed of topological insulator.

According to another aspect of the present disclosure, there is provided a solar cell, comprising a first electrode layer, a semiconductor film of first conduction type, a semiconductor film of second conduction type having characteristics of topological insulator and containing a germanium element, and a second electrode layer, which are formed successively on a substrate, wherein the semiconductor film of first conduction type mates with the semiconductor film of second conduction type having characteristics of topological insulator to form a p-n junction.

In the above solar cell, the semiconductor film of second conduction type may be a germanium halide film formed by halogenating the germanium film by using fluorine element, chlorine element, bromine element or iodine element.

In the above solar cell, the germanium halide film may have a thickness of 0.5~10 nm.

In the above solar cell, the germanium halide film is a germanium halide film having a single-atom layer thickness; or the germanium halide film is a germanium halide film having a double-atoms layer thickness; or the germanium halide film is a germanium halide film having a multi-atoms layer thickness.

In the above solar cell, the semiconductor film of second conduction type is a topological insulator film formed by topologizing the germanium film using hydrogen element, nitrogen element, boron element or sulfur element.

In the above solar cell, the semiconductor film of first conduction type may have a thickness of 100~5000 nm.

In the above solar cell, the first electrode layer may have a thickness of 1~500 nm, and may be made of a metal material or a composite conductive material; and/or, the second electrode layer may have a thickness of 1~500 nm, and may be made of a metal material or a composite conductive material.

In the above solar cell, at least a portion of at least one of the first electrode layer and the second electrode layer may be formed of topological insulator.

DETAILED DESCRIPTION OF PREFERRED EMBODIMENTS OF THE INVENTION

Technique solutions according to embodiments of the present invention will be described clearly and completely hereinafter in detail with reference to the attached drawings. It would be apparent that the described embodiments are only parts, rather than all, of the embodiments of the present invention. Other implementations made, based on the embodiments in the present invention, by those skilled in the art without any inventive work, fall within scopes of the present invention.

Figure 1:
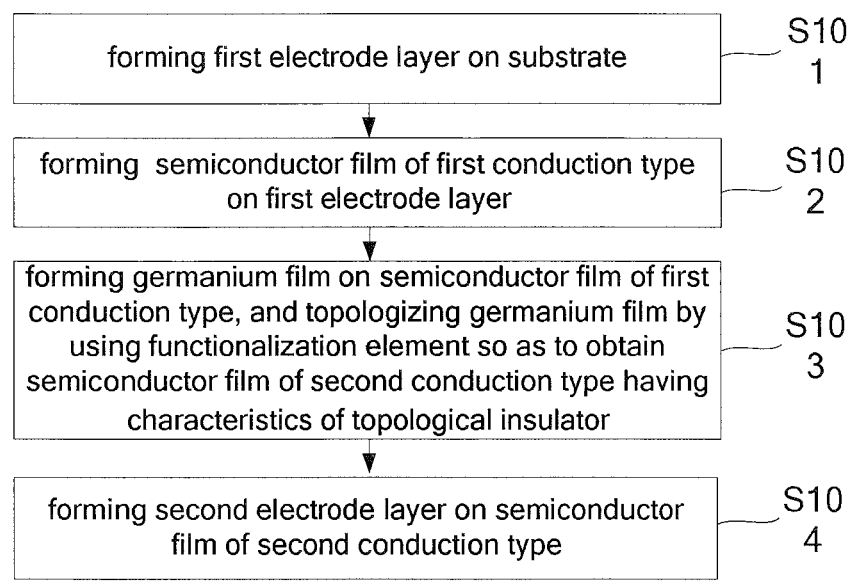
FIG. 1 is a flowchart of a method of manufacturing a solar cell according to an embodiment of the present disclosure.
Figure 2:
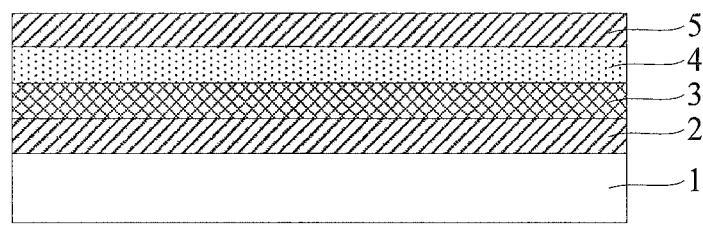
FIG. 2 is a structural schematic diagram of a solar cell according to an embodiment of the present disclosure.

Referring to FIG. 1 and FIG. 2, FIG. 1 is a flowchart of a method of manufacturing a solar cell according to an embodiment of the present disclosure; and FIG. 2 is a structural schematic diagram of a solar cell according to an embodiment of the present disclosure.

According to a general inventive concept of the present disclosure, there is provided a method of manufacturing a solar cell, comprising steps of: forming a first electrode layer on a substrate; forming a semiconductor film of first conduction type on the first electrode layer; forming a germanium film on the semiconductor film of first conduction type, and topologizing the germanium film by using functionalization element so as to obtain a semiconductor film of second conduction type having characteristics of topological insulator, the semiconductor film of first conduction type mating with the semiconductor film of second conduction type having characteristics of topological insulator to form a p-n junction; and forming a second electrode layer on the semiconductor film of second conduction type.

It will be appreciated that the semiconductor film of first conduction type may be one of a p-type semiconductor film and an n-type semiconductor film, and the semiconductor film of second conduction type may be the other one of the p-type semiconductor film and the n-type semiconductor film. Hereinafter, embodiments of the present disclosure will be described by taking a case, in which the semiconductor film of first conduction type is an n-type semiconductor film and the semiconductor film of second conduction type is p-type semiconductor film, as an example.

As shown in FIG. 1 and FIG. 2, a method of manufacturing a solar cell according to one embodiment of the present disclosure comprises the following steps:

step S101: forming a first electrode layer 2 on a substrate 1;

step S102: forming a n-type semiconductor film 3 on the first electrode layer 2;

step S102: forming a germanium film on the n-type semiconductor film 3, and topologizing the germanium film by using functionalization element so as to obtain a p-type semiconductor film 4 having characteristics of topological insulator, the n-type semiconductor film mating with the p-type semiconductor film having characteristics of topological insulator to form a p-n junction; and step S104: forming a second electrode layer 5 on the p-type semiconductor film 4.

In the solar cell manufactured according to the above method, the n-type semiconductor film 3 and the p-type semiconductor film 4 having characteristics of topological insulator form a homogeneous p-n junction or heterogeneous p-n junction of the solar cell, photons are absorbed by semiconductor materials so as to form photon-generated carriers (holes and electrons), holes and electrons will move and gather in opposite directions under a built-in electric field in the p-n junction, and a current will be generated once a circuit is closed, that is, a function of the solar cell is achieved. Since a theoretical value for the edge resistivity of the topological insulator may reach zero, a thermal loss of the p-type semiconductor film 4 having characteristics of topological insulator generated due to resistance effect is zero during carrier transportation, thereby enabling a highly-efficient solar cell, that is, the electric energy conversion efficiency of the solar cell is higher.

Thus, the solar cell manufactured according to the above method has higher electric energy conversion efficiency.

In one example, in the step S103, the step of forming the germanium film may be implemented in any one of the following ways:

Way I: forming the germanium film through an atomic layer deposition process;

Way II: forming the germanium film through a chemical vapor deposition process;

Way III: forming the germanium film through a mechanical stripping and transferring process;

Way IV: forming the germanium film through a magnetron sputtering process; and

Way V: forming the germanium film through a pulsed laser deposition process.

In one example, the functionalization element may be fluorine element, chlorine element, bromine element or iodine element.

In one example, in the step S103, the step of topologizing the germanium film by using functionalization element so as to obtain the p-type semiconductor film 4 having characteristics of topological insulator may comprise halogenating the germanium film to obtain a germanium halide film by using fluorine element, chlorine element, bromine element or iodine element. The germanium halide film has characteristics of a typical topological insulator.

In one example, the germanium halide film may be a germanium halide film having a single-atom layer thickness; or the germanium halide film may be a germanium halide film having a double-atoms layer thickness; or the germanium halide film may be germanium halide film having a multi-atoms layer thickness.

There are many choices for forming the n-type semiconductor film 3 on the first electrode layer 2 in step S102, and there are also many choices for forming the p-type semiconductor film 4 on the n-type semiconductor film 3 in step S103. For example, in one example, the n-type semiconductor film 3 may be an n-type silicon film, an n-type graphene film or an n-type germanium film.

In one example, the step S102 of forming the n-type semiconductor film 3 on the first electrode layer 2 may be implemented in the followings ways:

if the n-type semiconductor film 3 is an n-type silicon film, the step of forming the n-type semiconductor film 3 on the first electrode layer 2 may comprise: depositing a silicon film having a thickness of 150 nm on the first electrode layer 2 through a chemical vapor deposition process under a temperature of 200~400° C., and doping the silicon film with nitrogen element through a doping process so as to form the n-type semiconductor film 3;

if the n-type semiconductor film 3 is an n-type graphene film, the step of forming the n-type semiconductor film 3 on the first electrode layer 2 may comprise: depositing a graphene film having a thickness of 1 nm on the first electrode layer 2 through an atomic layer deposition process, and doping the graphene film with nitrogen element through a doping process so as to form the n-type semiconductor film 3;

if the n-type semiconductor film 3 is an n-type germanium film, the step of forming the n-type semiconductor film 3 on the first electrode layer 2 may comprise: forming a first germanium film on the first electrode layer 2 through a mechanical stripping and transferring process, and doping the first germanium film with nitrogen element so as to form the n-type semiconductor film 3.

In one example, the p-type semiconductor film 4 may be a germanium bromide film, a germanium chloride film, or a germanium iodide film.

In one example, halogenating the germanium film to obtain the germanium halide film by using fluorine element, chlorine element, bromine element or iodine element may be implemented in any one of the following ways:

In a first way, the germanium film is halogenated by a gas phase process.

Specifically, the first way may include:

halogenating the germanium film in a $BCl_3$ gas atmosphere with a gas pressure of 1~10 Pa and a treatment temperature of 250~350° C., and annealing the germanium film in a halogen gas atmosphere with a treatment temperature of 90~130° C., so as to form a germanium chloride film; or halogenating the germanium film in an iodine gas atmosphere with a gas pressure of 1~10 Pas and a treatment temperature of 60~100° C., so as to form a germanium iodide film; or halogenating the germanium film in a bromine gas atmosphere with a gas pressure of 1~10 Pa and a treatment temperature of 50~400° C., so as to form a germanium bromide film; or annealing the germanium film for 10 minutes in a chlorine gas atmosphere with a treatment temperature of 50~400° C., so as to form a germanium chloride film.

In a second way, the germanium film is halogenated by a liquid phase process.

Specifically, the second way may include: halogenating the germanium film in a liquid bromine environment with a liquid bromine concentration of 1%~50% and a treatment temperature of 20~80° C., so as to form the germanium bromide film.

In a third way, the germanium film is halogenated by a surface modification process.

Specifically, the third way may include: firstly, coating an organic colloid material containing halogen on a base, and then abutting, under a pressure, a side of base coated with the organic colloid material against a substrate on which the germanium film has been deposited, so that corresponding atomic groups containing halogen in the organic colloid material are transferred onto the germanium film by utilizing hydrophilic or hydrophobic characteristics of the atomic groups, thereby halogenating the germanium film. The germanium film may be topologized through a surface modification process in an approximate room temperature environment.

In a fourth way, the germanium film is halogenated by a plasma treatment process.

Specifically, the fourth way may include:

causing halogen plasma to impact a surface of the germanium film and be adsorbed in the germanium film in an inductively coupled plasma (ICP) apparatus or a reactive ion etching (RIE) apparatus with chlorine or carbon tetrachloride being used as a reactive gas, thereby halogenating the germanium film. Then the germanium film is topologized through the plasma treatment process, a treatment temperature of the plasma treatment process is low and a surface of the processed film layer can be made more uniform.

Of course, the n-type semiconductor film 3 formed in any of the above ways may mates with the p-type semiconductor film 4 formed in any of the above ways so as to form a p-n junction.

In one example, the germanium halide film may have a thickness of 0.5~10 nm, and the n-type semiconductor film 3 may have a thickness of 100~5000 nm.

In one example, the functionalization element may also be hydrogen element, nitrogen element, boron element or sulfur element.

As shown in FIG. 2, embodiments of the present disclosure also provide a solar cell comprising a first electrode layer 2, an n-type semiconductor film 3, a p-type semiconductor film 4 having characteristics of topological insulator and containing germanium element, and a second electrode layer 5, which are formed successively on a substrate 1, wherein the n-type semiconductor film 3 mates with the p-type semiconductor film 4 having characteristics of topological insulator to form a p-n junction.

In the above solar cell, the n-type semiconductor film 3 can mate with the p-type semiconductor film 4 having characteristics of topological insulator to form a homogeneous p-n junction or heterogeneous p-n junction of the solar cell, photons are absorbed by semiconductor materials so as to form photon-generated carriers (holes and electrons), holes and electrons will move and gather in opposite directions under a built-in electric field in the p-n junction, and a current will be generated once a circuit is closed, that is, a function of the solar cell is achieved. Since a theoretical value for the edge resistivity of the topological insulator may reach zero, a thermal loss of the p-type semiconductor film 4 having characteristics of topological insulator generated due to resistance effect is zero during carrier transportation, thereby enabling a highly-efficient solar cell, that is, the electric energy conversion efficiency of the solar cell is higher.

In one example, the p-type semiconductor film 4 may be a germanium halide film formed by halogenating a germanium film by using fluorine element, chlorine element, bromine element or iodine element In one example, the thickness of the germanium halide film may be 0.5~10 nm.

Preferably, the germanium halide film may be a germanium halide film having a single-atom layer thickness, or a germanium halide film having a double-atoms layer thickness, or a germanium halide film having a multi-atoms layer thickness.

In one example, the p-type semiconductor film 4 may be a germanium halide film formed by topologizing a germanium film by using hydrogen element, nitrogen element, boron element or sulfur element.

In one example, a thickness of the n-type semiconductor film 3 is 100~5000 nm.

In one example, the first electrode layer 2 may have a thickness of 1~500 nm, and may be made of a metal material or a composite conductive material; and/or, the second electrode layer 5 may have a thickness of 1~500 nm, and may be made of a metal material or a composite conductive material.

In one preferred example, at least a portion, for example, portions or all, of at least one of the first electrode layer 2 and the second electrode layer 5 is formed of topological insulator material, thereby enabling further reduction in conductor resistance and energy loss and improving energy conversion efficiency.

It would be apparent that the person skilled in the art may make various changes or modifications to the present disclosure without departing from spirit and scopes of the disclosure. Thus, if these changes or modifications to the present disclosure fall within scopes of claims and equivalents thereof of the present invention, the present invention is intended to include these changes or modifications therein.

What is claimed is:

1. A method of manufacturing a solar cell, comprising steps of:

forming a first electrode layer on a substrate;

forming a semiconductor film of first conduction type on the first electrode layer, the semiconductor film of first conduction type being a graphene film;

forming a topological insulator film on the semiconductor film of first conduction type, the topological insulator film being a semiconductor film of second conduction type containing germanium element, the semiconductor film of first conduction type mating with the semiconductor film of second conduction type to form a p-n junction; and forming a second electrode layer on the topological insulator film, wherein the first electrode layer, the semiconductor film of the first conduction type, the topological insulator film, and the second electrode layer are successively formed on the substrate.

2. The method according to claim 1, wherein the step of forming the topological insulator film comprises forming a germanium film on the semiconductor film of first conduction type, wherein the forming of the germanium film comprises one of:

forming the germanium film through an atomic layer deposition process;
forming the germanium film through a chemical vapor deposition process;
forming the germanium film through a mechanical stripping and transferring process;
forming the germanium film through a magnetron sputtering process; and
forming the germanium film through a pulsed laser deposition process; and
wherein the step of forming the topological insulator film further comprises topologizing the germanium film by using a functionalization element so as to obtain the topological insulator film.

3. The method according to claim 2, wherein the functionalization element is fluorine element, chlorine element, bromine element or iodine element.

4. The method according to claim 3, wherein the step of topologizing the germanium film by using functionalization element so as to obtain the topological insulator film comprises:
   halogenating the germanium film to obtain a germanium halide film by using fluorine element, chlorine element, bromine element or iodine element.

5. The method according to claim 4, wherein the step of halogenating the germanium film to obtain the germanium halide film comprises one of:
   halogenating the germanium film by a gas phase process;
   halogenating the germanium film by a liquid phase process;
   halogenating the germanium film by a surface modification process; and
   halogenating the germanium film by a plasma treatment process.

6. The method according to claim 5, wherein the semiconductor film of first conduction type is an n-type graphene film.

7. The method according to claim 6, wherein
   the step of forming the n-type graphene film on the first electrode layer comprises: depositing a graphene film having a thickness of 1 nm on the first electrode layer through an atomic layer deposition process, and doping the graphene film with nitrogen element through a doping process so as to form an n-type semiconductor film.

8. The method according to claim 5, wherein when halogenating the germanium film by the liquid phase process, the step of halogenating the germanium film to obtain the germanium halide film comprises: halogenating the germanium film in a liquid bromine environment with a liquid bromine concentration of 1%~10% and a treatment temperature of 40~80° C., so as to form the germanium bromide film.

9. The method according to claim 5, wherein when halogenating the germanium film by the gas phase process, the step of halogenating the germanium film to obtain the germanium halide film comprises:
   halogenating the germanium film in an iodine gas atmosphere with a gas pressure of 1~10 Pa and a treatment temperature of 60~100° C., so as to form a germanium iodide film; or
   halogenating the germanium film in a bromine gas atmosphere with a gas pressure of 1~10 Pa and a treatment temperature of 50~400° C., so as to form a germanium bromide film; or
   annealing the germanium film for 10 min in a chlorine gas atmosphere with a treatment temperature of 50~400° C., so as to form a germanium chloride film.

10. The method according to claim 5, wherein when halogenating the germanium film by the surface modification process, the step of halogenating the germanium film to obtain the germanium halide film comprises:
    coating an organic colloid material containing halogen on a base;
    abutting, under a pressure, a side of the base coated with the organic colloid material against the germanium film, so that halogen atoms in the organic colloid material are transferred to the germanium film, thereby halogenating the germanium film.

11. The method according to claim 5, wherein when halogenating the germanium film by the plasma treatment way, the step of halogenating the germanium film to obtain a germanium halide film comprises:
    causing halogen plasma to impact a surface of the germanium film in an inductively coupled plasma apparatus or a reactive ion etching apparatus, so that halogen plasma is absorbed in the germanium film, thereby halogenating the germanium film.

12. The method according to claim 2, wherein the functionalization element is hydrogen element, nitrogen element, boron element, or sulfur element.

13. The method according to claim 1, wherein at least a portion of at least one of the first electrode layer and the second electrode layer is formed of topological insulator.

14. A solar cell, comprising a first electrode layer, a semiconductor film of first conduction type, a topological insulator film and a second electrode layer, which are formed successively on a substrate, the semiconductor film of first conduction type being a graphene film, wherein the topological insulator film is a semiconductor film of second conduction type containing germanium element, and the semiconductor film of first conduction type mates with the semiconductor film of second conduction type to form a p-n junction.

15. The solar cell according to claim 14, wherein the semiconductor film of second conduction type is a germanium halide film formed by halogenating the germanium film by using fluorine element, chlorine element, bromine element or iodine element.

16. The solar cell according to claim 15, wherein the germanium halide film has a thickness of 0.5~10 nm.

17. The solar cell according to claim 15, wherein
    the germanium halide film is a germanium halide film having a single-atom layer thickness; or
    the germanium halide film is a germanium halide film having a double-atoms layer thickness; or
    the germanium halide film is a germanium halide film having a multi-atoms layer thickness.

18. The solar cell according to claim 14, wherein the semiconductor film of second conduction type is a topological insulator film formed by topologizing the germanium film using hydrogen element, nitrogen element, boron element or sulfur element.

19. The solar cell according to claim 14, wherein
    the first electrode layer has a thickness of 1~500 nm, and is made of a metal material or a composite conductive material; and/or,
    the second electrode layer has a thickness of 1~500 nm, and is made of a metal material or a composite conductive material.

20. The solar cell according to claim 14, wherein at least a portion of at least one of the first electrode layer and the second electrode layer is formed of topological insulator.

* * * * *